(12) United States Patent
Fujimoto

(10) Patent No.: US 11,565,444 B2
(45) Date of Patent: Jan. 31, 2023

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Masayoshi Fujimoto, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/164,970

(22) Filed: Feb. 2, 2021

(65) Prior Publication Data

US 2021/0245404 A1 Aug. 12, 2021

(30) Foreign Application Priority Data

Feb. 6, 2020 (JP) .............................. JP2020-019125

(51) Int. Cl.
| | | |
|---|---|---|
| *B29C 35/02* | (2006.01) | |
| *B29C 59/02* | (2006.01) | |
| *B29C 59/16* | (2006.01) | |
| *B29C 59/00* | (2006.01) | |
| *B29C 35/08* | (2006.01) | |

(52) U.S. Cl.
CPC ...... *B29C 35/0288* (2013.01); *B29C 35/0805* (2013.01); *B29C 59/002* (2013.01); *B29C 59/02* (2013.01); *B29C 59/16* (2013.01); *B29C 2035/0827* (2013.01)

(58) Field of Classification Search
CPC ....... B29C 59/02; B29C 59/002; B29C 59/16; B29C 35/0288; B29C 35/0805; G03F 7/0002
See application file for complete search history.

(56) References Cited

U.S. PATENT DOCUMENTS

| | | | | |
|---|---|---|---|---|
| 2009/0200710 A1* | 8/2009 | Khusnatdinov | ....... | B29C 59/026 264/293 |
| 2014/0027955 A1* | 1/2014 | Wakabayashi | .......... | B29C 59/02 264/447 |
| 2018/0329315 A1* | 11/2018 | Hirano | .................. | G03F 7/0002 |
| 2019/0179228 A1* | 6/2019 | Khusnatdinov | ....... | G03F 7/0002 |
| 2020/0310260 A1* | 10/2020 | Koide | ................... | G03F 7/0002 |

FOREIGN PATENT DOCUMENTS

| | | | | |
|---|---|---|---|---|
| JP | 2019075551 A | | 5/2019 | |
| JP | 2019080047 A | * | 5/2019 | ............. B29C 59/02 |

* cited by examiner

*Primary Examiner* — Jerzi H Moreno Hernandez

(74) *Attorney, Agent, or Firm* — Rossi, Kimms & McDowell LLP

(57) ABSTRACT

An imprint apparatus including an irradiation unit configured to irradiate a peripheral region of a pattern region of a mold with light while the mold is in contact with an imprint material on a substrate so as to make a polymerization degree of the imprint material between the peripheral region and the substrate fall within a range higher than a polymerization degree in an initial state when the imprint material is supplied onto the substrate and lower than a polymerization degree in a final state when the imprint material is cured, and a control unit configured to control, for each shot region on the substrate, a value of a second parameter for controlling irradiation with the light from the irradiation unit based on a value of a first parameter for controlling a contact step.

9 Claims, 10 Drawing Sheets

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method and an article manufacturing method.

Description of the Related Art

An imprint apparatus forms, on a substrate, a pattern formed from a cured imprint material by curing the imprint material while a mold is in contact with the imprint material supplied (arranged) onto the substrate. When bringing a mold into contact with an imprint material supplied to a shot region on a substrate, the imprint apparatus applies a force (pressing force) to the mold and imprint material. This sometimes causes the imprint material on the substrate to move so as to spread out of a shot region or the edge of the substrate (that is, out of the pattern region of the mold) (to be referred to as "oozing" hereinafter).

Under the circumstance, a technique for preventing oozing has been proposed in Japanese Patent Laid-Open No. 2019-75551. Japanese Patent Laid-Open No. 2019-75551 discloses a technique of irradiating with ultraviolet light the vicinity of the boundary of a region in which a pattern is to be formed, that is, a technique associated with so-called frame exposure, when bringing a mold into contact with an imprint material supplied to a shot region (edge shot region) including an edge on a substrate. It is possible to prevent the oozing of an imprint material by curing the imprint material spreading toward the edge of the substrate by frame exposure.

In the imprint apparatus, however, parameters for controlling a contact step of bringing a mold into contact with an imprint material on a substrate (for example, the relative tilt and pressing force between a mold and a substrate) differ in value in accordance with a shot region on the substrate. For this reason, the manner of how an imprint material on a substrate spreads upon contact between a mold and the imprint material differs in accordance with a short region on the substrate. Accordingly, it is necessary to control (adjust) the values of parameters for controlling frame exposure for each shot region in order to prevent the oozing of an imprint material. However, Japanese Patent Laid-Open No. 2019-75551 discloses no such countermeasures.

SUMMARY OF THE INVENTION

The present invention provides an imprint apparatus advantageous in reducing the occurrent of the oozing of an imprint material from the pattern region of a mold.

According to one aspect of the present invention, there is provided an imprint apparatus that forms a pattern of an imprint material on a substrate by using a mold, the apparatus including a moving unit configured to bring the mold into contact with an imprint material on the substrate by relatively moving the mold and the substrate, an irradiation unit configured to irradiate a peripheral region of a pattern region of the mold with light while the mold is in contact with an imprint material on the substrate so as to make a polymerization degree of the imprint material between the peripheral region and the substrate fall within a range higher than a polymerization degree in an initial state when the imprint material is supplied onto the substrate and lower than a polymerization degree in a final state when the imprint material is cured, and a control unit configured to control, for each shot region on the substrate, a value of a second parameter for controlling irradiation with the light from the irradiation unit based on a value of a first parameter for controlling a contact step of bringing the mold into contact with the imprint material on the substrate.

Further aspects of the present invention will become apparent from the following description of exemplary embodiments with reference to the attached drawings.

DESCRIPTION OF THE EMBODIMENTS

Figure 1:
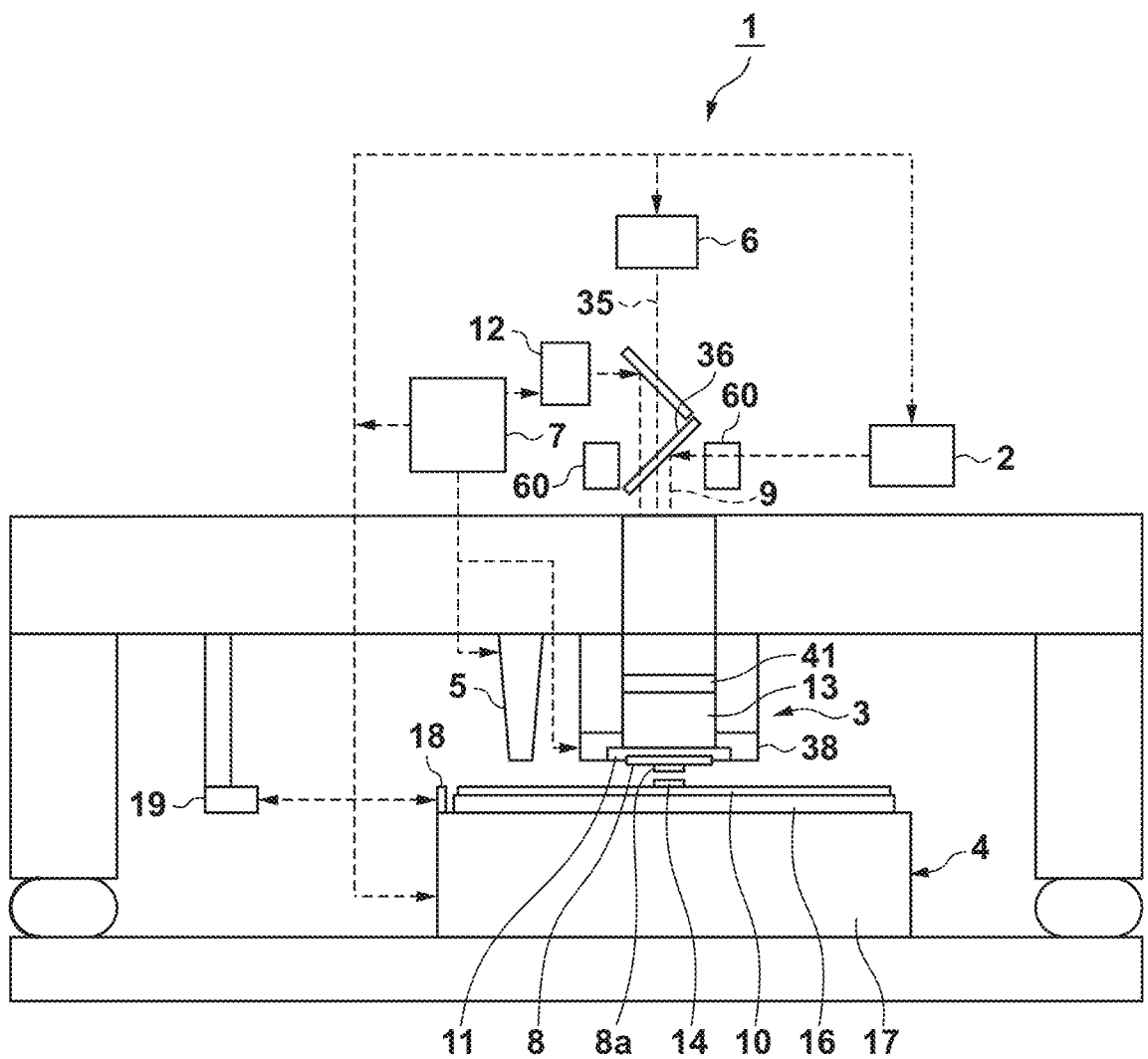
FIG. 1 is a schematic view illustrating configurations of an imprint apparatus as one aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating the configuration of an imprint apparatus 1 according to one aspect of the present invention. The imprint apparatus 1 is used for a lithography process as a manufacturing process for devices such as semiconductor devices, liquid crystal display devices, and magnetic storage media as articles. The imprint apparatus 1 is a lithography apparatus that forms a pattern on a substrate, or more specifically, forms a pattern of an imprint material on a substrate by using a mold. The imprint apparatus 1 brings an uncured imprint material supplied onto a substrate into contact with a mold (brings a mold into contact with an imprint material on the substrate to perform imprinting) and applies curing energy to the imprint material to form a pattern of the cured material onto which the pattern of the mold is transferred. A mold is also called a template and an original.

As the imprint material, a curable composition (to be also referred to as a resin in an uncured state) to be cured by receiving curing energy is used. An example of the curing energy that is used is electromagnetic waves and the like. As the electromagnetic waves, for example, infrared light, visible light, ultraviolet light, and the like selected from the wavelength range of 10 nm (inclusive) to 1 mm (inclusive) is used. More specific examples of the electromagnetic wave are infrared light, a visible light beam, and ultraviolet light.

The curable composition is a composition cured by light irradiation. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater (spin coating method) or a slit coater (slit coating method). The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

An imprint apparatus 1 includes a mold holding unit 3 (imprint head) that holds and moves a mold 8, a substrate holding unit 4 (stage) that holds and moves a substrate 10, and a supply unit 5 (dispenser) that supplies an imprint material onto a substrate. The imprint apparatus 1 includes a first irradiation unit 2 that irradiates an imprint material with light 9 for curing the imprint material, an image capturing unit 6 that captures an image depicting a contact state between the mold 8 and an imprint material on a substrate by irradiation with light 35, and a control unit 7 that controls the overall imprint apparatus 1. The imprint apparatus 1 also includes a detection unit 12 that detects marks (alignment marks) formed on the mold 8 and the substrate 10 and a second irradiation unit 60.

The imprint apparatus 1 uses, as an imprint material, an ultraviolet curable imprint material that is cured upon irradiation with the light 9, for example, ultraviolet light (that is, uses a photocuring method as a curing method for an imprint material). Note, however, that the imprint material curing method is not limited to the photocuring method, and a heat-curing method of curing an imprint material by using heat may be used. When using the heat-curing method, the imprint apparatus 1 includes a beating unit that applies heat to cure an imprint material in place of the first irradiation unit 2.

In the specification and the accompanying drawings, directions will be indicated by an XYZ coordinate system in which directions parallel to the surface of a substrate 10 are set as the X-Y plane. Directions parallel to the X-axis, the Y-axis, and the Z-axis of the XYZ coordinate system are the X direction, the Y direction, and the Z direction, respectively, and a rotation about the X-axis, a rotation about the Y-axis, and a rotation about the Z-axis are OX, 8Y, and OZ, respectively.

The substrate holding unit 4 includes a substrate chuck 16 that holds the substrate 10 and a substrate moving unit 17 that moves the substrate 10 (the substrate chuck 16 that supports the substrate 10) along at least two axes, that is, the X-axis direction and the Y-axis direction in the XYZ coordinate system. The substrate moving unit 17 includes, for example, an actuator. The position of the substrate holding unit 4 is obtained by using a mirror 18 provided on the substrate holding unit 4 and an interferometer 19. However, the position of the substrate holding unit 4 may be obtained by using an encoder in place of the mirror 18 and the interferometer 19.

The mold holding unit 3 includes a mold chuck 11 that holds the mold 8 and a mold moving unit 38 that moves the mold 8 (the mold chuck 11 that holds the mold 8) along at least one axis, that is, the Z direction (vertical direction) in the XYZ coordinate system. The mold moving unit 38 includes, for example, an actuator. The mold moving unit 38 moves the mold chuck 11 downward (-Z direction) to bring a pattern region 8a of the mold 8 into contact with an imprint material 14 on the substrate. When the mold 8 (pattern region 8a) comes into contact with the imprint material 14 on the substrate, the control unit 7 performs control to apply a constant force (pressing force) to the mold 8 and the imprint material 14 on the substrate. After the imprint material 14 on the substrate is cured, the mold moving unit 38 moves the mold chuck 11 upward (+Z direction) to separate (release) the pattern region 8a of the mold 8 from the cured imprint material 14 on the substrate.

In this embodiment, the mold moving unit 38 functions as a moving unit that relatively moves the mold 8 and the substrate 10 to bring the mold 8 into contact with the imprint material 14 on the substrate. However, this is not exhaustive. For example, the substrate moving unit 17 may move the substrate chuck 16 upward (-Z direction) to bring the pattern region 8a of the mold 8 into contact with the imprint material 14 on the substrate. The mold moving unit 38 may move the mold chuck 11 downward, and the substrate moving unit 17 may move the substrate chuck 16 upward to bring the pattern region 8a of the mold 8 into contact with the imprint material 14 on the substrate. In this manner, at least one of the substrate moving unit 17 and the mold moving unit 38 may function as a moving unit that brings the mold 8 into contact with the imprint material 14 on the substrate by relatively moving the mold 8 and the substrate 10.

The mold holding unit 3 that holds the mold 8 includes a posture adjusting unit that adjusts the tilt of the mold 8. Likewise, the substrate holding unit 4 that holds the substrate 10 includes a posture adjusting unit that adjusts the tilt of the substrate 10. Correcting the relative tilt between the mold 8 and the substrate 10 by using these posture adjusting units can make the mold 8 and the substrate 10 parallel. The relative tilt between the mold 8 and the substrate 10 may be corrected by using one or both of the mold holding unit 3 and the substrate holding unit 4.

The mold holding unit 3 is provided with a convex portion for forming a space 13 defined (partitioned) by a partition plate 41 and the mold 8. Adjusting the pressure in the space 13 makes it possible to deform the mold 8 (the pattern region 8a of the mold 8) when bringing the mold 8 into contact with the imprint material 14 on the substrate or separating the mold 8 from the cured imprint material 14 on the substrate. For example, when bringing the mold 8 into contact with the imprint material 14 on the substrate, increasing the pressure in the space 13 can bring the pattern region 8a of the mold 8 into contact with the imprint material 14 on the substrate while the mold 8 is deformed in a convex shape with respect to the substrate 10.

The detection unit 12 detects marks formed on the mold 8 and the substrate 10. The mold 8 can be aligned with the substrate 10 by obtaining the relative position (positional shift) between the mold 8 and the substrate 10 from the detection results obtained by the detection unit 12 and moving at least one of the mold 8 and the substrate 10.

The control unit 7 is constituted by an information processing apparatus (computer) including a CPU and a memory. The control unit 7 operates the imprint apparatus 1 by comprehensively controlling the respective units of the imprint apparatus 1 in accordance with programs stored in a storage unit. The control unit 7 controls an imprint process of forming a pattern on each shot region on a substrate and associated processes. The control unit 7 may be provided inside or outside the apparatus.

First Embodiment

The operation of an imprint apparatus 1, that is, an imprint process of forming a pattern in each shot region by molding an imprint material 14 on a substrate with a mold 8, will be described with reference to FIG. 2.

In step S101, a substrate 10 is loaded into the imprint apparatus 1. More specifically, the substrate 10 is loaded into the imprint apparatus 1 via a substrate conveying mechanism (not illustrated) and held by a substrate chuck 16 of a substrate holding unit 4.

In step S102, the imprint material 14 is supplied onto the substrate. More specifically, a supply unit 5 supplies the imprint material 14 to a short region (target shot region) on the substrate on which a pattern of the imprint material 14 is formed.

In step S103, a mold 8 is brought into contact with the imprint material 14 on the substrate (contact step). More specifically, the imprint material 14 supplied onto the substrate is brought into contact with a pattern region 8a of the mold 8 by relatively bringing the mold 8 close to the substrate 10.

Figure 3A:
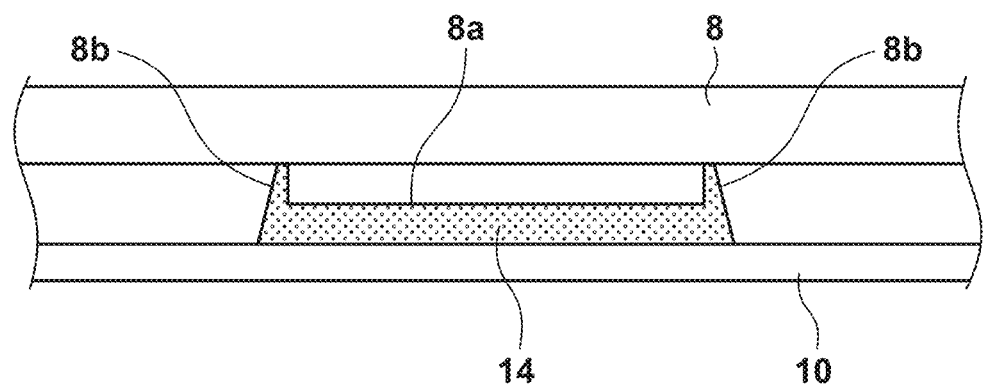
FIGS. 3A and 3B are views for describing the oozing of an imprint material.
Figure 3A:
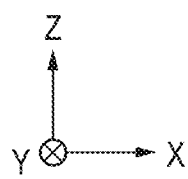
Figure 3B:
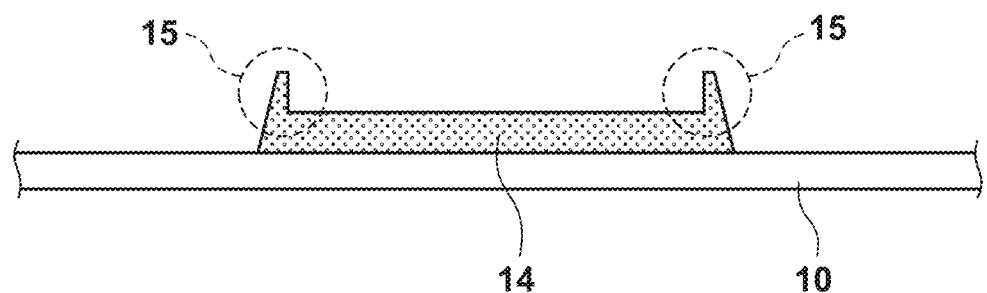
Figure 3B:
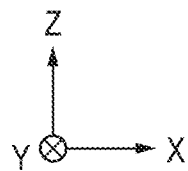

In the contact step, as illustrated in FIG. 3A, if the wettability between the imprint material 14 on the substrate and the mold 8 is good, the imprint material 14 sometimes oozes out of the shot region or the edge of the substrate 10, that is, the pattern region 8a of the mold 8 (oozing). The imprint material 14 that has oozed out of the pattern region 8a of the mold 8 adheres to a side surface 8b of the pattern region 8a. When the imprint material 14 adhering to the side surface 8b of the pattern region 8a of the mold 8 is cured, the pattern of the imprint material 14 having a protruding portion 15 is formed upon separation of the mold 8 from the imprint material 14, as illustrated in FIG. 3B. In such a case, the pattern of the imprint material 14 formed on the substrate has an uneven film thickness. This may influence an etching process in a subsequent step. In addition, part of the imprint material 14 adhering to the side surface 8b of the pattern region 8a of the mold 8 may fall on the substrate during an imprint process and become a foreign substance. If a foreign substance is present on the substrate, the mold 8 may come into contact with the foreign substance to break the pattern formed in the pattern region 8a of the mold 8, thereby causing a failure in pattern formation. Note that FIG. 3B omits the illustration of fine concave-convex pattern corresponding to the pattern region 8a of the mold 8.

This embodiment is configured to achieve high yield by reducing the adhesion of the imprint material 14 to the side surface 8b of the pattern region 8a of the mold 8 and preventing (reducing) failures in pattern formation and the breakage of the mold 8. More specifically, frame exposure is performed in step S104 concurrently with a contact step (S103) of bringing the mold 8 into contact with the imprint material 14 on the substrate. More specifically, a second irradiation unit 60 irradiates a peripheral region (a region including the edge (outer peripheral portion) of the pattern region 8a) in the pattern region 8a of the mold 8 with light 50. Frame exposure is performed to irradiate the imprint material 14 between the peripheral region of the pattern region 8a of the mold 8 and the substrate 10 with the light 50 so as to increase the polymerization degree (viscosity) of the imprint material 14 without curing the imprint material 14. In other words, the imprint material 14 is irradiated with the light 50 such that the polymerization degree of the imprint material 14 falls within a range higher than the polymerization degree in an initial state when the imprint material 14 is supplied onto the substrate and lower than the polymerization degree in a final state when the imprint material 14 is cured. This can suppress the spreading of the imprint material 14 toward the edge of a shot region on the substrate and prevent (reduce) the oozing of the imprint material 14. In this embodiment, the second irradiation unit 60 irradiates the peripheral region of the pattern region 8a of the mold 8 with the light 50 (frame exposure is performed) before part of the pattern region 8a of the mold 8 comes into contact with the imprint material 14 on the substrate and a contact step (S103) is finished. On the other hand, the central region in the pattern region 8a of the mold 8 (the region in which a pattern to be transferred to the substrate 10 is formed) is not irradiated with the light 50. Accordingly, the polymerization degree of the imprint material 14 in the central region of the pattern region 8a of the mold 8 does not change (increase), and the filling property with respect to the pattern (concave portion) formed in the pattern region 8a of the mold 8 is maintained.

In step S105, the mold 8 is aligned with the substrate 10. The alignment between the mold 8 and the substrate 10 is performed after the contact step (S103) of bringing the mold 8 into contact with the imprint material 14 on the substrate is finished and the pattern of the pattern region 8a of the mold 8 is sufficiently filled with the imprint material 14. For example, a detection unit 12 detects marks formed on the mold 8 and the substrate 10, and the mold 8 is aligned with the substrate 10 based on the detection result.

As described above, the imprint material 14 in the peripheral region of the pattern region 8a of the mold 8 has changed (increased) in polymerization degree but is not cured. If the imprint material 14 near (in the peripheral region) the side surface 8b of the mold 8 is cured to prevent the imprint material 14 from adhering to the side surface 8b of the pattern region 8a of the mold 8 as in the conventional technique, it is difficult to align the mold 8 with the substrate 10. In addition, when a fine structure (pattern) is arranged in a portion near the side surface 8b of the pattern region 8a of the mold 8, the imprint material 14 is cured before filling the fine structure, resulting in an increase in non-filling defects. A deterioration in the alignment accuracy (overlap accuracy) between the mold 8 and the substrate 10 and an increase in non-filling defects lead to a decrease in yield.

In step S106, it is determined whether the positional shift between the mold 8 and the substrate 10 falls within an allowable range. If the positional shift between the mold 8 and the substrate 10 does not fall within the allowable range, the process shifts to step S105 to continue the alignment between the mold 8 and substrate 10. Note that if the positional shift between the mold 8 and the substrate 10 does not fall within the allowable range even with the continuation of the alignment between the mold 8 and the substrate 10, the process may be forcibly shifted to the next step. In contrast, if the positional shift between the mold 8 and the substrate 10 falls within the allowable range, the process shifts to step S107.

In step S107, a first irradiation unit 2 irradiates the imprint material 14 with light 9 to cure the imprint material 14 while the mold 8 is in contact with the imprint material 14 on the substrate (through the mold 8)(curing step).

In step S108, the mold 8 is separated from the cured imprint material 14 on the substrate (release step). More specifically, the mold 8 is separated from the cured imprint material 14 on the substrate by relatively moving the mold 8 and the substrate 10 away from each other.

In step S109, it is determined whether an imprint process is complete for designated shot regions on the substrate (for example, all the shot regions on the substrate). If the imprint process is not complete for the designated shot regions on the substrate, the process shifts to step S102 to continue the imprint process for the next shot region on the substrate. Accordingly, each step is repeated until the completion of the imprint process for the designated shot regions on the substrate. If the imprint process is complete for the designated shot regions on the substrate, the process shifts to step S110.

In step S110, the substrate 10 is unloaded from the imprint apparatus 1. More specifically, the substrate 10 held by the substrate chuck 16 of the substrate holding unit 4 is unloaded out of the imprint apparatus 1 via a substrate conveying mechanism (not illustrated).

This embodiment is configured to control the values of irradiation parameters for controlling irradiation with the light 50 by the second irradiation unit 60 in frame exposure based on the values of contact parameters for controlling a contact step of bringing the mold 8 into contact with the imprint material 14 on the substrate. In this case, a contact parameter (first parameter) includes at least one of the relative tilt between the mold 8 and the substrate 10, a force (imprinting force) applied to the mold 8 and the imprint material 14, the pressure applied to the space 13, and a period during which the mold 8 is in contact with the imprint material 14. An irradiation parameter (second parameter) includes at least one of the timing when the second irradiation unit 60 starts irradiation with the light 50, the intensity of the light 50 applied from the second irradiation unit 60, and a period of irradiation with the light 50 by the second irradiation unit 60.

Figure 4A:
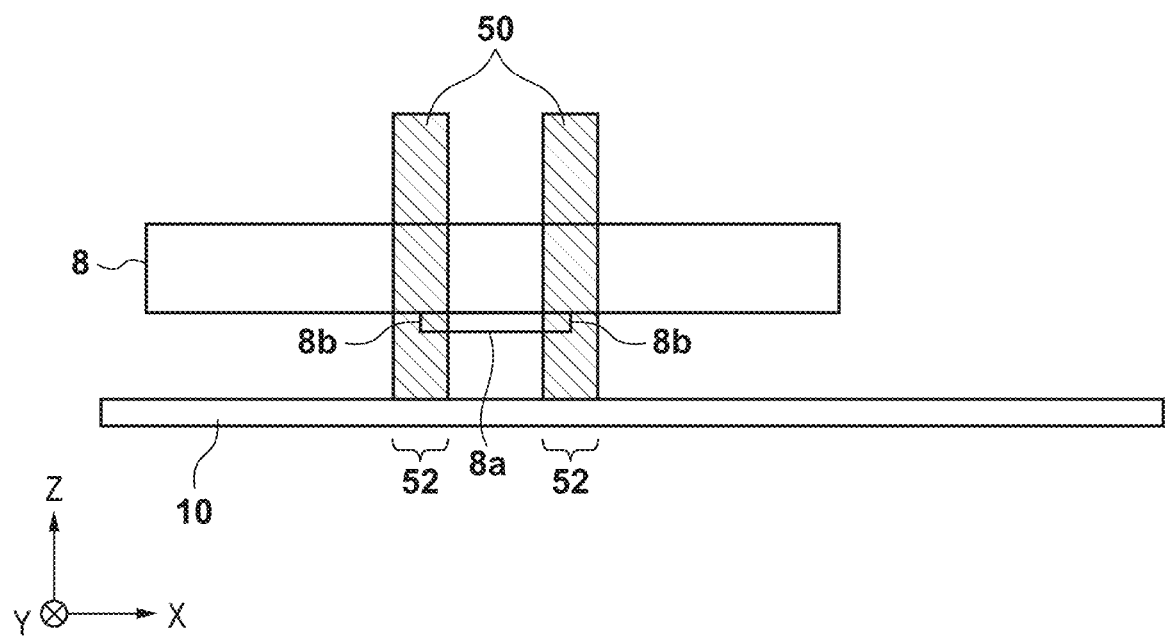
FIGS. 4A and 4B are views for describing a step of irradiating a peripheral region on the pattern region of a mold with light.

The following is a detailed description of a step (S104) of making the second irradiation unit 60 irradiate the peripheral region of the pattern region 8a of the mold 8 with the light 50, with contact parameters and irradiation parameters being concretized. FIG. 4A is a side view illustrating the relationship between an irradiation region 52 irradiated with the light 50 and the side surface 8b(edge) of the pattern region 8a of the mold 8. As illustrated in FIG. 4A, the second irradiation unit 60 irradiates the peripheral region (irradiation region 52) including the side surface 8b as the edge of the pattern region 8a of the mold 8 with the light 50. The light 50 is not limited to ultraviolet light as long as the light causes the imprint material 14 to undergo a polymerization reaction. If the imprint material 14 is cured by irradiation with the light 50, the alignment (step S105) between the mold 8 and the substrate 10 cannot be performed. Accordingly, the imprint material 14 is irradiated with the light 50 strong enough to increase the polymerization degree of the imprint material 14 without curing the imprint material 14 located near the side surface 8b of the pattern region 8a of the mold 8. The wavelength of the light 50 applied from the second irradiation unit 60 and the like are determined as appropriate in consideration of the characteristics of the imprint material 14.

Figure 4B:
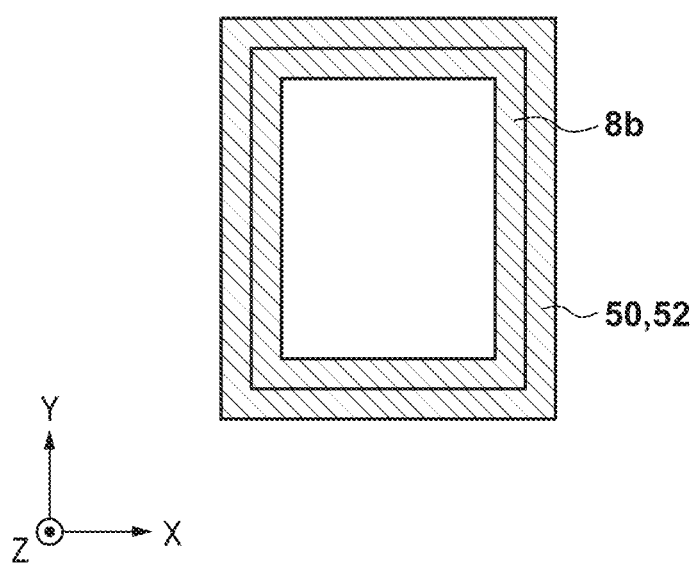

FIG. 4B is a plan view illustrating the relationship between the irradiation region 52 irradiated with the light 50 and the side surface 8b of the pattern region 8a of the mold 8. As illustrated in FIG. 4B, the irradiation region 52 is a region corresponding to a peripheral region including the side surface 8b of the pattern region 8a of the mold 8. Setting the irradiation region 52 like that illustrated in FIG. 4B can prevent the oozing of the imprint material 14 in a contact step.

Figure 5A:
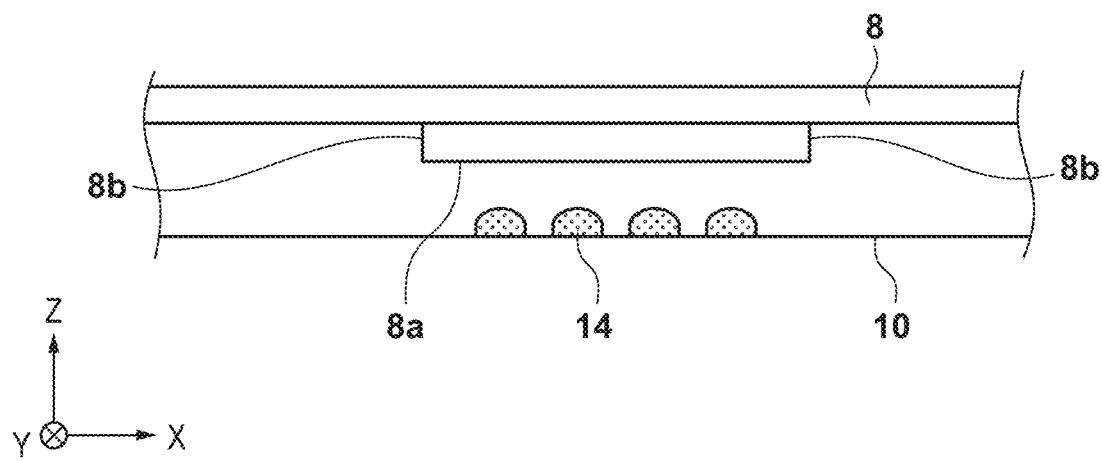
FIG. 5A to FIG. 5C are views for describing the spreading of an imprint material in a contact step.
Figure 5B:
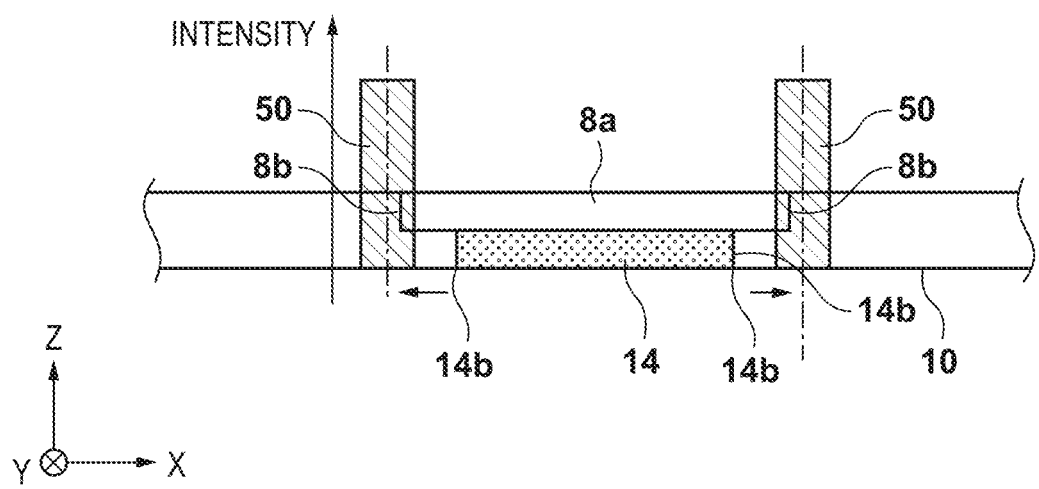
Figure 5C:
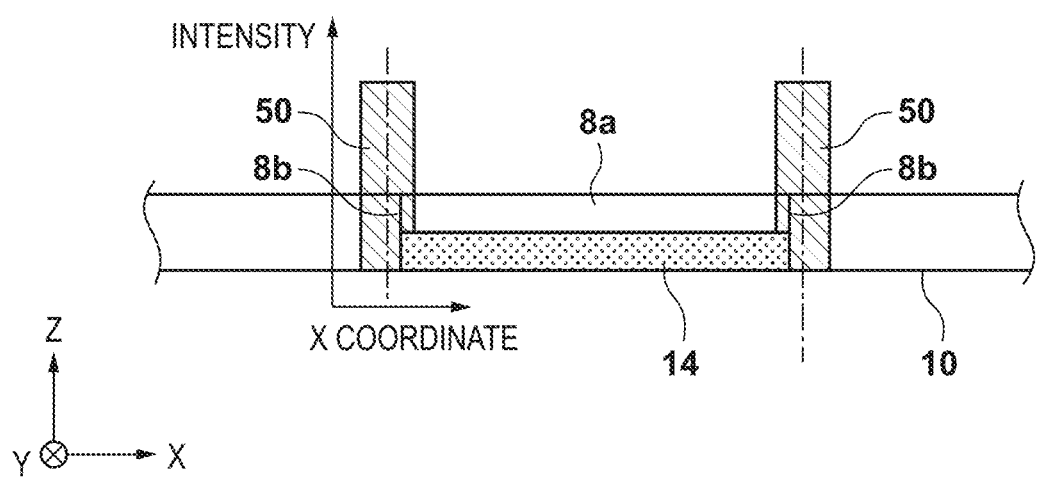

The spreading (state) of the imprint material 14 in a contact state will be described with reference to FIGS. 5A, 5B, and 5C. As illustrated in FIG. 5A, the imprint material 14 on the substrate exists as a plurality of droplets before the mold 8 is brought into contact with the imprint material 14. When the mold 8 is brought into contact with the imprint material 14 (droplets) on the substrate in the state illustrated in FIG. 5A, the imprint material 14 starts to spread toward the outside (edge) of the pattern region 8a of the mold 8 as illustrated in FIG. 5B. As the imprint material 14 spreads, the light 50 starts the polymerization reaction of an interface (gas-liquid interface) 14b that has reached the irradiation region 52 to be irradiated with the light 50, thereby increasing the polymerization degree of the interface 14b of the imprint material 14, as illustrated in FIG. 5C. Increasing the polymerization degree of the interface 14b of the imprint material 14 will control the moving speed of the imprint material 14 to prevent the interface 14b of the imprint material 14 spreading toward the outside of the pattern region 8a of the mold 8 from reaching the side surface 8b of the pattern region 8a until the imprint material 14 is cured. This can prevent the imprint material 14 from adhering to the side surface 8b of the pattern region 8a of the mold 8. An irradiation parameter required to change (increase) the polymerization degree of the imprint material 14, for example, the intensity of the light 50 or the timing (irradiation start timing) of starting irradiation with the light 50, differs depending on the type of the imprint material 14. Accordingly, the intensity of the light 50 and the irradiation start timing need to be searched out by experiments and simulations.

Figure 6:
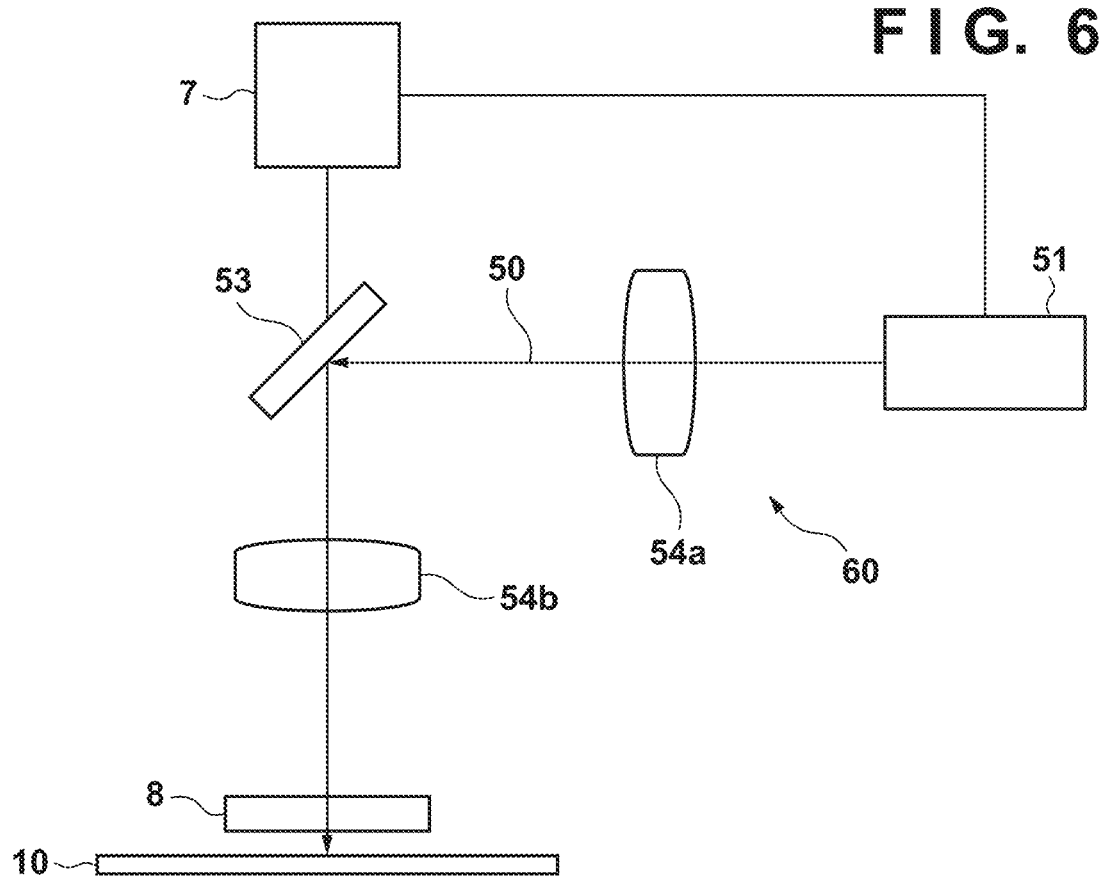
FIG. 6 is a view illustrating an example of the configurations of a second irradiation unit.

FIG. 6 illustrates an example of the configurations of the second irradiation unit 60 that irradiates the peripheral region including the side surface 8b of the pattern region 8a of the mold 8 with the light 50. The second irradiation unit 60 includes a light source 51, a light modulation element 53, and optical elements 54a and 54b. The light source 51 emits the light 50 having a wavelength that causes the polymerization reaction of the imprint material 14. As the light source 51, a light source from which an output required to cause the polymerization reaction of the imprint material 14 up to a predetermined viscosity can be obtained is selected. The light source 51 is constituted by, for example, a lamp, laser diode, or LED.

Light from the light source 51 is guided to the light modulation element (space light modulation element) 53 via the optical element 54a. In this embodiment, the light modulation element 53 is constituted by a digital micromirror device (DMD). Note, however, that the light modulation element 53 is not limited to the DMD and may be constituted by another type of device such as an LCD device or LCOS device. Arranging the light modulation element 53 between the light source 51 and the substrate 10 can control (set) the irradiation region 52 to an arbitrary position or control the intensity of the light 50 to an arbitrary intensity. The magnification at which the light 50 having undergone control on the irradiation region 52 and light intensity by the light modulation element 53 is applied (projected) onto the peripheral region of the pattern region 8a of the mold 8 is adjusted via the optical element 54b.

Figure 7:
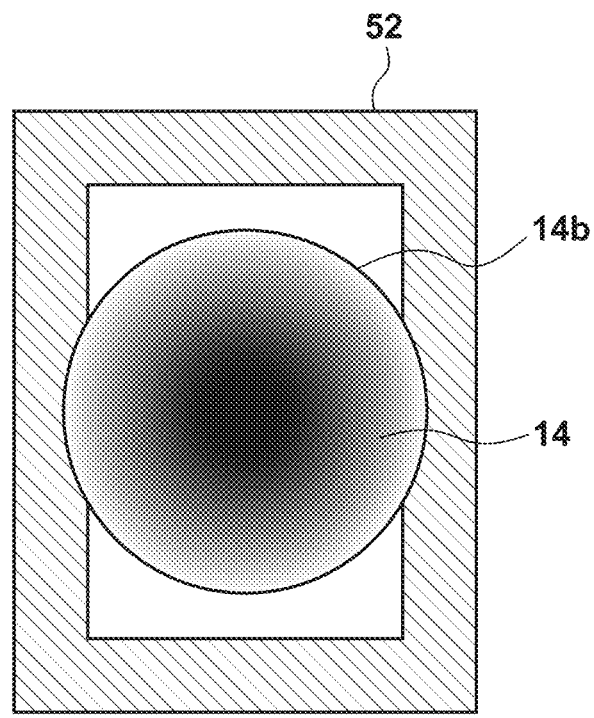
FIG. 7 is a view for describing the spreading of an imprint material in a contact step.

In a contact step (S103), bringing the mold 8 into contact with the imprint material 14 will cause the interface 14b of the imprint material 14 to spread in a circular shape or a shape similar to a circle outside the pattern region 8a of the mold 8, as illustrated in FIG. 7. In other words, the contract area between the mold 8 and the imprint material 14 changes so as to spread from the vicinity of the center of the pattern region 8a of the mold 8. In general, since the pattern region 8a of the mold 8 is rectangular, the irradiation region 52 is also a rectangular region along the edge of the pattern region 8a of the mold 8. Accordingly, the timing when the interface 14b of the imprint material 14 reaches the irradiation region 52 (the edge of the pattern region 8a of the mold 8) differs depending on each position in the irradiation region 52.

If the timing when the second irradiation unit 60 irradiates the irradiation region 52 with the light 50 is earlier than the timing when the interface 14b of the imprint material 14 reaches the irradiation region 52, a non-filling defect may occur in a region near the side surface 8b of the pattern region 8a of the mold 8. In contrast, if the timing when the second irradiation unit 60 irradiates the irradiation region 52 with the light 50 is later than the timing when the interface 14b of the imprint material 14 reaches the irradiation region 52, the imprint material 14 may ooze out of the pattern region 8a of the mold 8 and adhere to the side surface 8b. In order to prevent the oozing of the imprint material 14, therefore, it is necessary to properly control the timing when the second irradiation unit 60 irradiates the irradiation region 52 with the light 50.

Figure 8A:
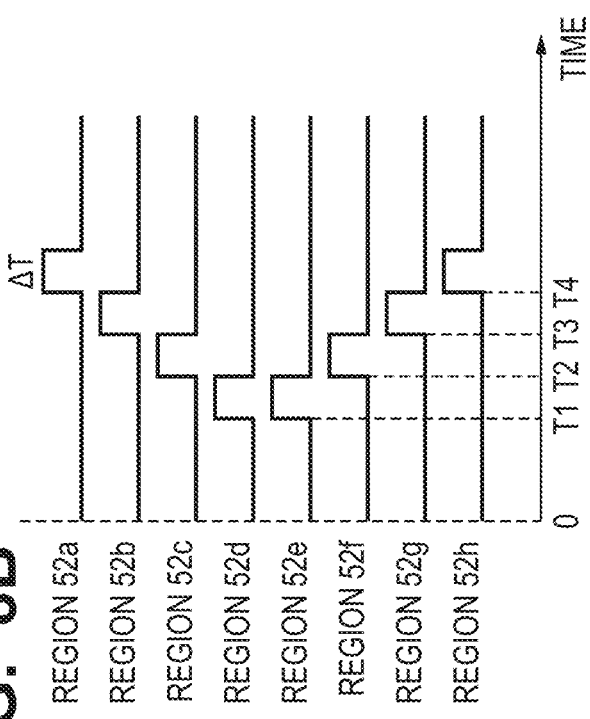
FIG. 8A to FIG. 8D are views for describing irradiation of each region of an irradiation region with light.

Accordingly, in this embodiment, as illustrated in FIG. 8A, the irradiation region 52 (the peripheral region of the pattern region 8a of the mold 8) is segmented (divided) into a plurality of regions 52a to 52x. The embodiment is configured to control as an irradiation parameter, for each of the plurality of regions 52a to 52x, at least one of the timing when the second irradiation unit 60 starts irradiation with the light 50, that is, the irradiation start timing, and the intensity of the light 50 applied from the second irradiation unit 60. A control unit 7 can control the irradiation start timing or the intensity of the light 50 by using the light modulation element 53.

In this embodiment, as illustrated in FIG. 8A, although the irradiation region 52 is segmented into a total of 24 regions 52a to 52x by segmenting the irradiation region 52 into eight regions in the vertical direction (Y direction) and six regions in the horizontal direction (X direction). However, this is not exhaustive. In addition, each of the 24 regions 52a to 52x has a square shape. However, this is not exhaustive. For example, each region may have a rectangular or triangular shape. The number of regions into which the irradiation region 52 is segmented and the shape of each segmented region of the irradiation region 52 can be arbitrarily set.

Figure 8B:
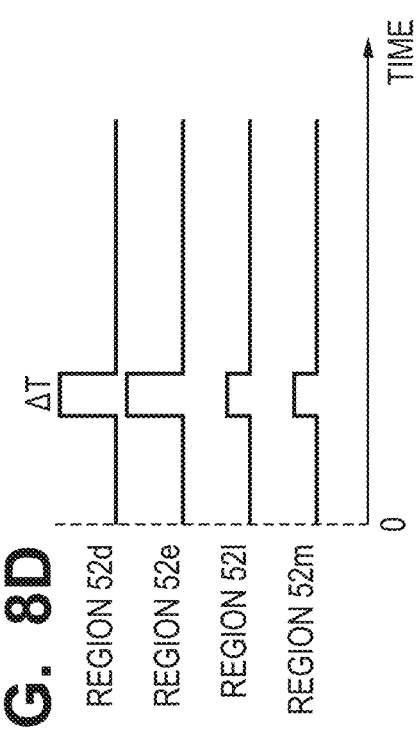

FIG. 8B illustrates the irradiation start timings for the regions 52a to 52x of the irradiation region 52. In this case, as illustrated in FIG. 7, it is assumed that the interface 14b of the imprint material 14 on the substrate spreads from the vicinity of the center of the pattern region 8a of the mold 8 to the outside. For the sake of simplicity, FIG. 8B illustrates the irradiation start timings for only the regions 52a to 52h of the irradiation region 52 (the plurality of regions 52a to 52x) which are located on the left side of the pattern region 8a of the mold 8. Referring to FIG. 8B, the abscissa represents the time, and the ordinate represents the intensity.

When a contact step starts, the interface 14b of the imprint material 14 for the irradiation region 52 spreads to reach the regions 52d and 52e at time T1, the regions 52c and 52f at time T2, the regions 52b and 52g at time T3, and the regions 52a and 52h at time T4. Accordingly, as illustrated in FIG. 8B, irradiation with the light 50 starts in the order of the regions that the interface 14b of the imprint material 14 reaches earlier, more specifically, in the order of the regions 52d and 52e, the regions 52c and 52f, the regions 52b and 52g, and the regions 52a and 52h.

Irradiation parameters, that is, the irradiation start timing, the intensity of the light 50, and the period (irradiation time) of irradiation with the light 50, can be arbitrarily set for each region of the irradiation region 52. Referring to FIG. 8B, the irradiation time for each region of the irradiation region 52 is set to a constant time $\Delta T$, and the intensity of the light 50 irradiating each region of the irradiation region 52 remains the same.

In a contact step, when the mold 8 is brought into contact with the imprint material 14, in order to improve the alignment accuracy between the mold 8 and the substrate 10, the parallelism between the mold 8 and the substrate 10 is sometimes intentionally shifted to relatively tilt the mold 8 and the substrate 10. In this case, shifting the parallelism between the mold 8 and the substrate 10 will change the distribution of forces (pressures) applied to the mold 8 and deform the mold 8.

Figure 9:
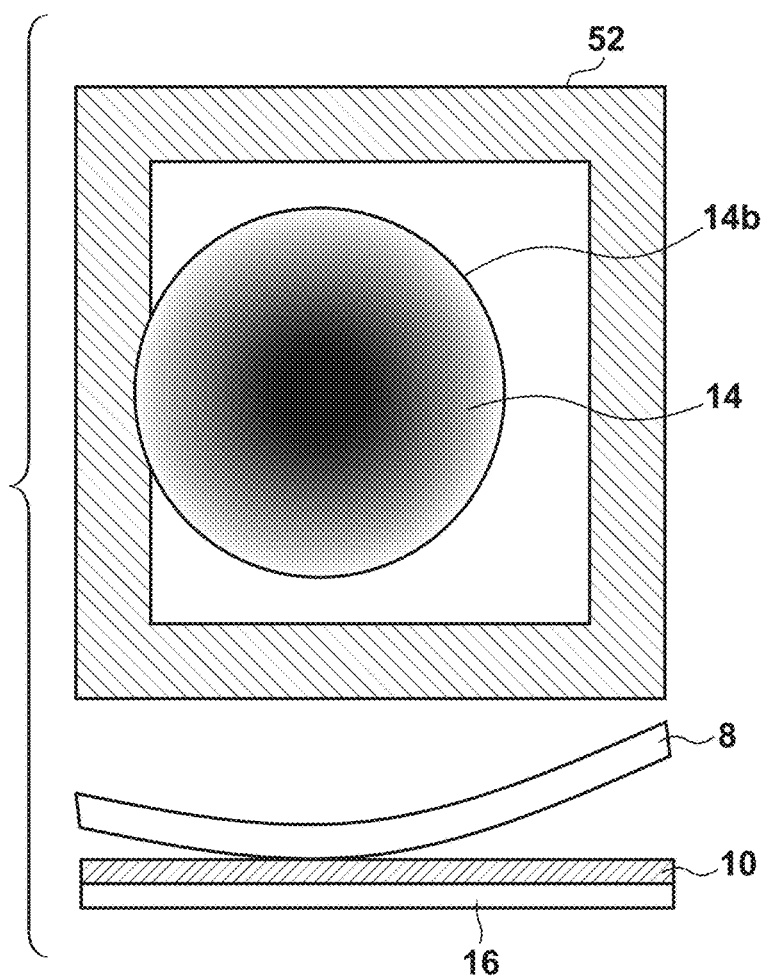
FIG. 9 is a view for describing the spreading of an imprint material in a contact step.

FIG. 9 is a view for describing how the imprint material 14 spreads when the mold 8 is tilted and brought into contact with the imprint material 14 on the substrate. When the tilted mold 8 is brought into contact with the imprint material 14 on the substrate, the center of the interface 14b of the imprint material 14 spreading outward in a circular shape is shifted from the center of the pattern region 8a of the mold 8, as illustrated in FIG. 9. When the contact step further proceeds from the state illustrated in FIG. 9, a left part of the interface 14b of the imprint material 14 reaches the left edge of the pattern region 8a of the mold 8. At this time, the interface 14b of the imprint material 14 has not reached the right edge of the pattern region 8a of the mold 8 which is symmetrical to the left edge. Accordingly, in order to prevent the oozing of the imprint material 14, it is necessary to properly control the timing when the second irradiation unit 60 irradiates each region of the irradiation region 52 with the light 50 in accordance with the relative tilt between the mold 8 and the substrate 10.

Accordingly, this embodiment is configured to change the timing of irradiation with the light 50 by the second irradiation unit 60 in accordance with the relative tilt between the mold 8 and the substrate 10 for each of the plurality of regions 52a to 52x of the irradiation region 52. More specifically, the embodiment is configured to change the irradiation start timing for each of the regions 52a to 52x so as to prevent the oozing of the imprint material 14 in each of the regions 52a to 52x of the irradiation region 52.

For example, this embodiment is configured to obtain in advance a table indicating the relationship between the relative tilt between the mold 8 and the substrate 10 and the irradiation start timing when the amount of the imprint material 14 oozing out of the side surface 8b of the mold 8 upon completion of a contact step becomes zero. The irradiation start timing for each region of the irradiation region 52 is determined from this table.

In addition, the amount of the imprint material 14 oozing out of the side surface 8b of the mold 8 upon completion of a contact step depends on the timing when the interface 14b of the imprint material 14 reaches each region of the irradiation region 52. Accordingly, the relationship between the relative tilt between the mold 8 and the substrate 10 and the timing when the interface 14b of the imprint material 14 reaches each region of the irradiation region 52 may be obtained in advance, and the irradiation start timing for each region of the irradiation region 52 may be determined from the obtained relationship.

Figure 8C:
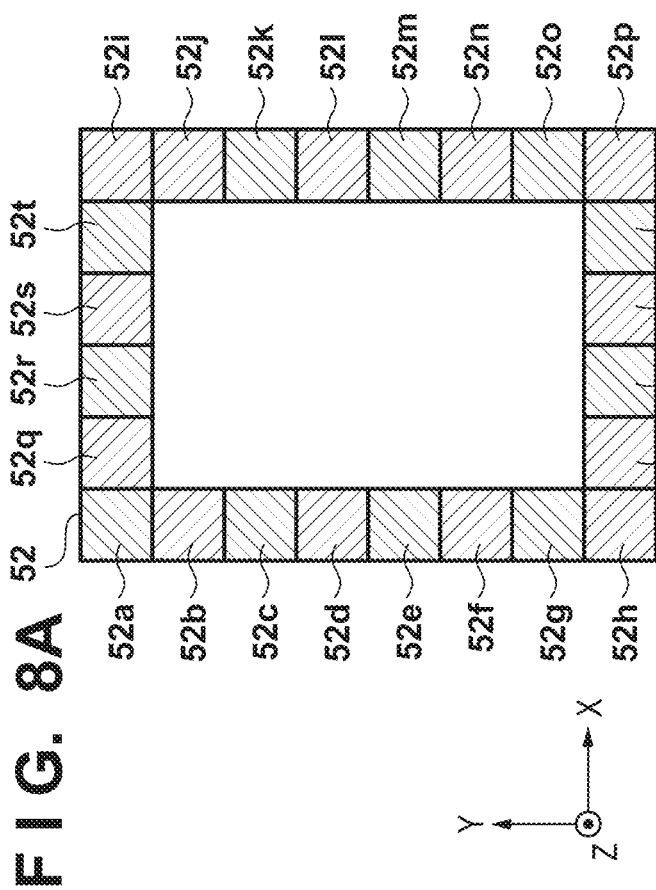

FIG. 8C illustrates the irradiation start timing for each of the regions 52a to 52x of the irradiation region 52. In this case, as illustrated in FIG. 9, it is assumed that the mold 8 is tilted and brought into contact with the imprint material 14 on the substrate. For the sake of simplicity, FIG. 8C illustrates the irradiation start timings for only some regions 52d, 52e, 52l, and 52m of the irradiation region 52 (the plurality of regions 52a to 52x) which are located on the right and left sides of the pattern region 8a of the mold 8. Referring to FIG. 8C, the abscissa represents the time, and the ordinate represents the intensity.

As illustrated in FIG. 8C, the timing when the second irradiation unit 60 starts irradiation with the light 50 is quickened more for the regions that the interface 14b of the imprint material 14 reaches earlier after the start of a contact step. More specifically, as illustrated in FIG. 8C, when a contact step starts, the interface 14b of the imprint material 14 which spreads from a position shifted from the center of the pattern region 8a of the mold 8 to the left reaches the regions 52d and 52e at time T5. Accordingly, irradiation of the regions 52d and 52e of the irradiation region 52 with the light 50 is started at time T5. The interface 14b of the imprint material 14 then reaches the regions 52l and 52m at time T6. Accordingly, irradiation of the regions 52l and 52m of the irradiation region 52 with the light 50 is started at time T6.

The amount (exposure amount) of the light 50 with which the irradiation region 52 (each region of the irradiation region 52) irradiated by the second irradiation unit 60 may be controlled (changed) in place of the timing when the second irradiation unit 60 starts irradiation with the light 50. An exposure amount is expressed by the product of the intensity of the light 50 and the irradiation time (the period during which the irradiation region 52 is irradiated with the light 50), and the polymerization degree of the imprint material 14 changes in accordance with the exposure amount.

Figure 8D:
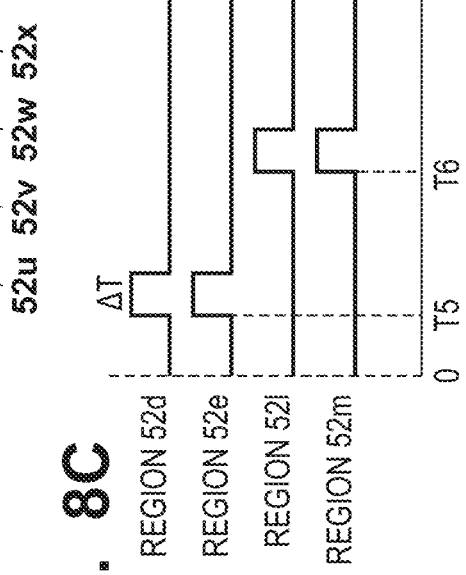

FIG. 8D illustrates the irradiation start timings for the regions 52d, 52e, 52l, and 52m of the irradiation region 52 at the time of controlling the exposure amount when the mold 8 is tilted and brought into contact with the imprint material 14 on the substrate, as illustrated in FIG. 9. Referring to FIG. 8D, the abscissa represents the time, and the ordinate represent the intensity. Referring to FIG. 8D, the irradiation time for the regions 52d, 52e, 52l, and 52m of the irradiation region 52 is set to the constant time ΔT, and the intensity of the light 50 irradiating each region of the irradiation region 52 is changed. More specifically, the intensity of the light 50 applied from the second irradiation unit 60 is increased for the regions 52d and 52e of the irradiation region 52 that the interface 14b of the imprint material 14 reaches first. The intensity of the light 50 applied from the second irradiation unit 60 is reduced for the regions 52l and 52m of the irradiation region 52 that the interface 14b of the imprint material 14 reaches next. In this case, the above description is about the case in which the irradiation time during which the irradiation region 52 is irradiated with the light 50 is constant, and the intensity of the light 50 is changed. However, the irradiation time during which the irradiation region 52 is irradiated with the light 50 may be changed while the intensity of the light 50 is constant. Alternatively, it is possible to change both the irradiation time during which the irradiation region 52 is irradiated with the light 50 and the intensity of the light 50.

This embodiment has exemplified the imprint process for one shot region on the substrate. In practice, however, an imprint process is performed for a plurality of shot regions on a substrate. At this time, when the parallelism between the mold 8 and the substrate 10 is intentionally shifted to improve the alignment accuracy between the mold 8 and the substrate 10, the parallelism between the mold 8 and the substrate 10 (the relative tilt between the mold 8 and the substrate 10) basically differs for each shot region. In such a case, an irradiation start timing may be determined for each shot region. For example, a plurality of tables are obtained in advance each of which indicates the relationship between each relative tilt between the mold 8 and the substrate 10 and the irradiation start timing when the amount of the imprint material 14 oozing out of the side surface 8b of the mold 8 upon completion of a contact step becomes zero. One table corresponding to the relative tilt between the mold 8 and the substrate 10 at the timing when the interface 14b of the imprint material 14 reaches each region of the irradiation region 52 is selected from the plurality of tables. This makes it possible to determine the irradiation start timing for each region of the irradiation region 52 for each shot region. In addition, a plurality of tables may be obtained in advance each of which indicates the relationship between each relative tilt between the mold 8 and the substrate 10 and the exposure amount at which the amount of the imprint material 14 oozing out of the side surface 8b of the mold 8 upon completion of a contact step becomes zero. One table corresponding to the relative tilt between the mold 8 and the substrate 10 at the timing when the interface 14b of the imprint material 14 reaches each region of the irradiation region 52 is selected from the plurality of tables. This makes it possible to determine, for each shot region, an exposure amount corresponding to each region of the irradiation region 52, that is, the intensity and irradiation time of the light 50.

As described above, in this embodiment, based on the values of impressing parameters for controlling a contact step, the values of irradiation parameters for controlling irradiation with the light 50 are determined so as to set to zero the amount of the imprint material 14 oozing out of the pattern region 8a of the mold 8 upon completion of the contact step. In addition, every time the value of a contact parameter is changed (adjusted) for each shot region on the substrate, one table corresponding to the adjusted contact parameter is selected to determine the value of the contact parameter. Therefore, the embodiment can provide an imprint apparatus advantageous in reducing the occurrence of the oozing of the imprint material 14 from the pattern region 8a of the mold 8.

Second Embodiment

This embodiment will exemplify a case in which when a mold 8 is brought into contact with an imprint material 14 on a substrate, irradiation parameters for controlling irradiation with light 50 by a second irradiation unit 60 are controlled (changed) in accordance with the force (pressing force) applied to the mold 8 and the imprint material 14. In a contact step, the pressing force is sometimes changed to improve the alignment accuracy between the mold 8 and the substrate 10. In this case, the distribution of forces (pressures) applied to the mold 8 is changed to deform the mold 8.

When the pressing force changes, the amount of an imprint material 14 oozing out of a pattern region 8*a* of the mold 8 changes over the entire periphery of the pattern region 8*a*. For example, as the pressing force is increased, the imprint material 14 oozes more out of the pattern region 8*a* of the mold 8. As the pressing force is reduced, the amount of the imprint material 14 oozing out of the pattern region 8*a* of the mold 8 decreases. This may cause a non-filling defect.

Accordingly, when a pressing force as a contact parameter is changed, it is also effective to control the irradiation start timing as in the first embodiment. Changing the irradiation start timing, that is, the timing of increasing the polymerization degree of the imprint material 14, can control the timing when the imprint material 14 (an interface 14*b* of the imprint material 14) reaches the edge of the pattern region 8*a* of the mold 8. In step S107, the irradiation start timing is controlled to prevent the imprint material 14 from oozing out of the pattern region 8*a* of the mold 8 at the timing of curing the imprint material 14. This makes it possible to suppress the oozing of the imprint material 14 out of the pattern region 8*a* of the mold 8 and the occurrence of a non-filling defect.

Figure 10:
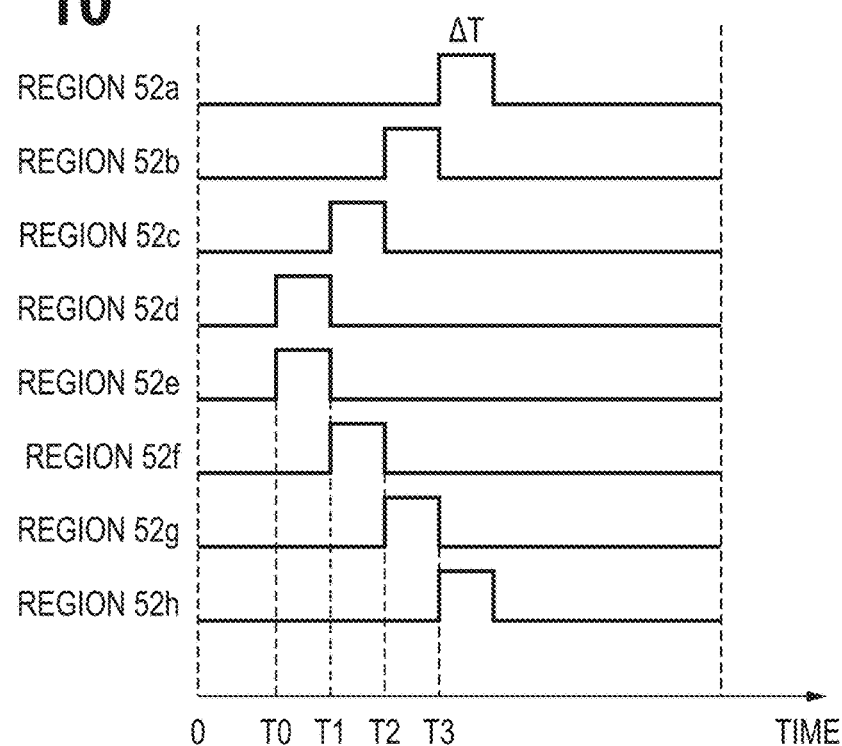
FIG. 10 is a view for describing irradiation of each region of an irradiation region with light.

In addition, controlling the polymerization degree of the imprint material 14 by changing the irradiation start timing can control the timing when the imprint material 14 reaches the edge of the pattern region 8*a* of the mold 8. FIG. 10 illustrates the irradiation start timings for regions 52*a* to 52*h* of an irradiation region 52 when the pressing force is increased in comparison with the irradiation start timings illustrated in FIG. 8B. Referring to FIG. 10, the abscissa represents the time, and the ordinate represents the intensity. As the pressing force increases, the imprint material 14 reaches the irradiation region 52 as follows. The imprint material 14 reaches the regions 52*d* and 52*e* at time T0, the regions 52*c* and 52*f* at time T1, the regions 52*b* and 52*g* at time T2, and the regions 52*a* and 52*h* at time T3. Accordingly, as illustrated in FIG. 10, irradiation with the light 50 is started in the order of the regions that the interface 14*b* of the imprint material 14 reaches earlier, more specifically, in the order of the regions 52*d* and 52*e*, the regions 52*c* and 52*f*, the regions 52*b* and 52*g*, and the regions 52*a* and 52*h*. In this manner, the irradiation start timings for the regions 52*a* to 52*h* of the irradiation region 52 are quickened more than the irradiation start timings illustrated in FIG. 8B. This makes it possible to suppress the oozing of the imprint material 14 out of the pattern region 8*a* of the mold 8 and the occurrence of a non-filling defect.

In an imprint process for a plurality of shot regions on a substrate, when the pressing force is changed to improve the alignment accuracy between the mold 8 and the substrate 10, the pressing force differs for each shot region. In such a case, an irradiation start timing may be determined for each shot region. For example, a plurality of tables are obtained in advance each of which indicates the relationship between each pressing force and the irradiation start timing when the amount of the imprint material 14 oozing out of a pattern region 8*b* of the mold 8 upon completion of a contact step becomes zero. One table corresponding to a pressing force at the timing when the interface 14*b* of the imprint material 14 reaches each region of the irradiation region 52 is selected from the plurality of tables. This makes it possible to determine an irradiation start timing corresponding to each region of the irradiation region 52. Alternatively, a plurality of tables may be obtained in advance each of which indicates the relationship between each pressing force and an exposure amount at which the amount of the imprint material 14 oozing out of the pattern region 8*b* of the mold 8 upon completion of a contact step becomes zero. One table corresponding to an impression force at the timing when the interface 14*b* of the imprint material 14 reaches each region of the irradiation region 52 is selected from the plurality of tables. This makes it possible to determine an exposure amount for each region of the irradiation region 52, that is, the intensity and irradiation time of the light 50, for each shot region.

As described above, this embodiment can provide an imprint apparatus advantageous in reducing the occurrence of the oozing of the imprint material 14 out of the pattern region 8*a* of the mold 8.

Third Embodiment

This embodiment will exemplify a case in which irradiation parameters for controlling irradiation with light 50 by a second irradiation unit 60 are controlled (changed) in accordance with the pressure applied to a mold (space 13) to deform a pattern region 8*a* when the mold 8 is brought into contact with an imprint material 14 on a substrate. In a contact step, the pressure applied to the space 13 is sometimes changed to improve the alignment accuracy between the mold 8 and a substrate 10.

Increasing the pressure applied to the space 13 can bring the mold 8 into contact with the imprint material 14 while deforming the mold 8 in a convex shape with respect to the substrate 10. In this case, the pressure on the edge of the pattern region 8*a* of the mold 8 becomes relatively lower than that the vicinity of the center of the pattern region 8*a* of the mold 8. Accordingly, the amount of the imprint material 14 oozing out of the pattern region 8*a* of the mold 8 is smaller than that before the pressure applied to the space 13 is changed.

In addition, reducing the pressure applied to the space 13 can bring the mold 8 into contact with the imprint material 14 on the substrate 10 while deforming the mold 8 in a concave shape with respect to the substrate 10. In this case, the pressure on the edge of the pattern region 8*a* of the mold 8, especially the pressure on the four corners, becomes stronger than that the vicinity of the center of the pattern region 8*a* of the mold 8. Accordingly, the amount of the imprint material 14 oozing out of the pattern region 8*a* of the mold 8 increases as compared with that before the pressure applied to the space 13 is changed.

In an imprint process for a plurality of shot regions on a substrate, when the pressure applied to the space 13 is changed to improve the alignment accuracy between the mold 8 and the substrate 10, the pressure applied to the space 13 basically differs for each shot region. In such a case, an irradiation start timing may be determined for each shot region. For example, a plurality of tables are obtained in advance each of which indicates the relationship between each pressure applied to the space 13 and the irradiation start timing when the amount of the imprint material 14 oozing out of a pattern region 8*b* of the mold 8 upon completion of a contact step becomes zero. One table corresponding to the pressure applied to the space 13 at the timing when an interface 14*b* of the imprint material 14 reaches each region of the irradiation region 52 is selected from the plurality of tables. This makes it possible to determine an irradiation start timing for each region of the irradiation region 52 for each shot region. Alternatively, a plurality of tables may be obtained in advance each of which indicates the relationship between each pressure applied to the space 13 and the exposure amount at which the amount of the imprint material 14 oozing out of the pattern region 8b of the mold 8 upon completion of a contact step becomes zero. One table corresponding to the pressure applied to the space 13 at the timing when the interface 14b of the imprint material 14 reaches each region of the irradiation region 52 is selected from the plurality of tables. This makes it possible to determine an exposure amount for each region of the irradiation region 52, that is, the intensity and irradiation time of the light 50.

As described above, this embodiment can provide an imprint apparatus advantageous in reducing the occurrence of the oozing of the imprint material 14 from the pattern region 8a of the mold 8.

In the above embodiment, the time from a contact step (S103) to a curing step (S107) can be arbitrarily set. The amount of the imprint material 14 supplied onto the substrate which oozes out of the pattern region 8b of the mold 8 changes in accordance with the time from a contact step to a curing step because the imprint material 14 vaporizes between the contact step and the curing step. In such a case, a plurality of tables are obtained in advance each of which indicates the relationship between each time from a contact step to a curing step and the irradiation start timing when the amount of the imprint material 14 oozing out of the pattern region 8b of the mold 8 upon completion of the contact step becomes zero. For each shot region, one table corresponding to the time from a contact step to a curing step is selected from the plurality of tables. This makes it possible to determine the irradiation start timing corresponding to each region of the irradiation region 52 for each shot region. Alternatively, a plurality of tables may be obtained in advance each of which indicates the relationship between each time from a contact step to a curing step and the exposure amount at which the amount of the imprint material 14 oozing out of the pattern region 8b of the mold 8 upon completion of the contact step becomes zero. For each shot region, one table corresponding to the time from a contact step to a curing step is selected from the plurality of tables. This makes it possible to determine an exposure amount for each region of the irradiation region 52, that is, the intensity and irradiation time of the light 50.

Figure 11:
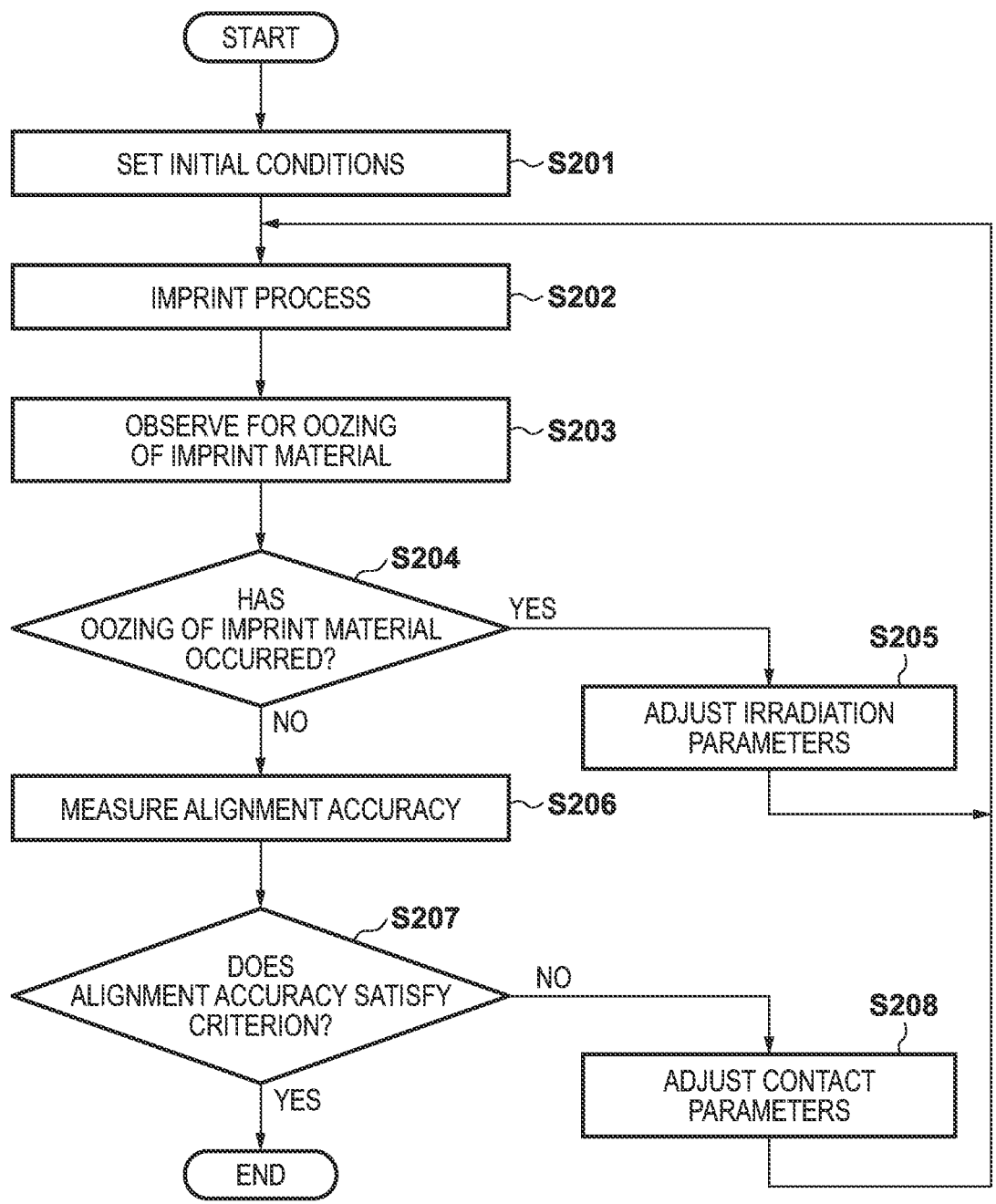
FIG. 11 is a flowchart for describing a general process associated with adjustment for suppressing the oozing of an imprint material and adjustment for alignment accuracy.

A general process (conventional technique) associated with adjustment for suppressing the oozing of the imprint material 14 and adjustment for alignment accuracy will be described below as a comparative example with reference to FIG. 11.

In step S201, initial conditions for contact parameters and irradiation parameters are set in accordance with a device.

Figure 2:
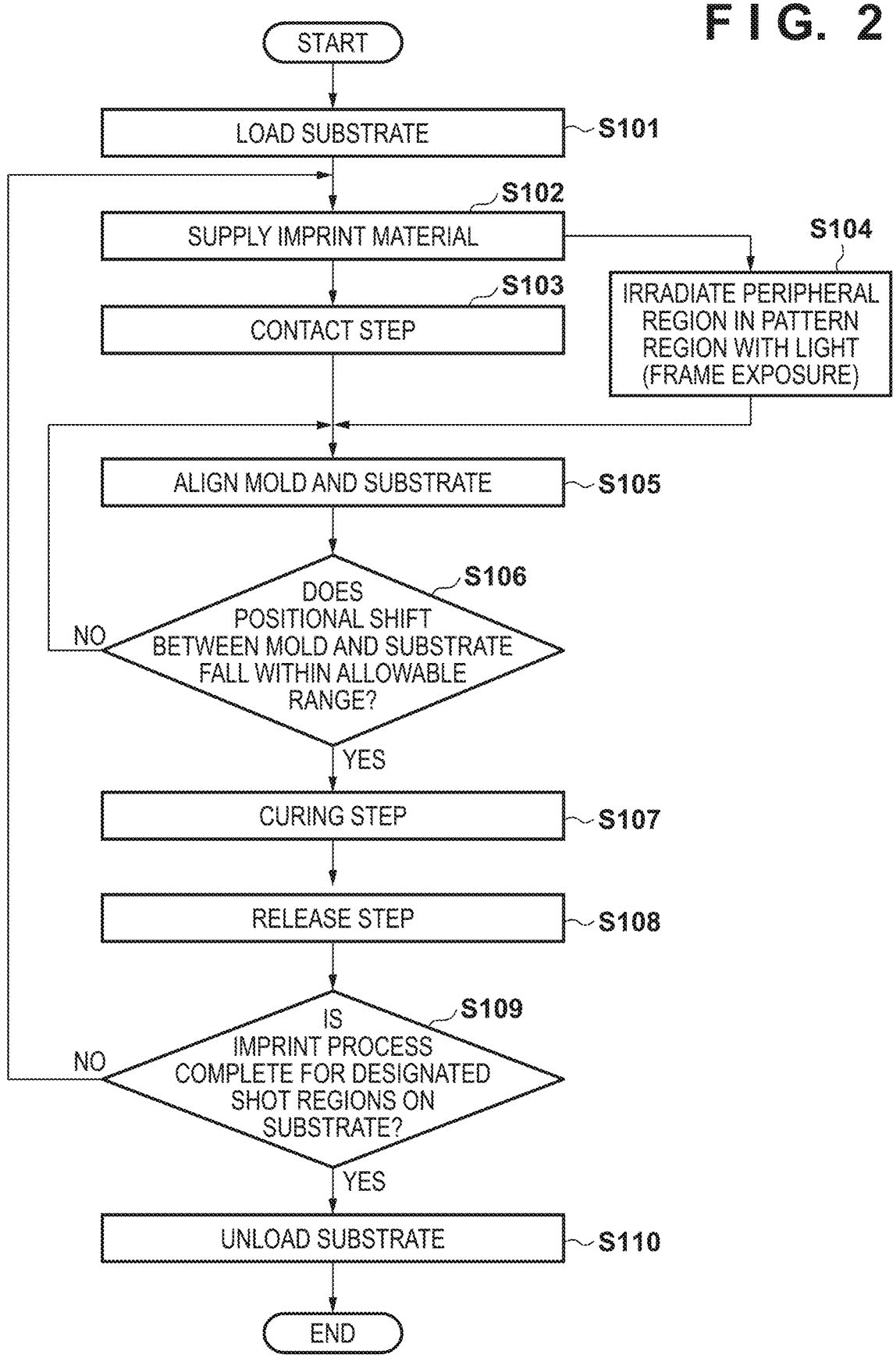
FIG. 2 is a flowchart for describing the operation of an imprint apparatus.

In step S202, the imprint process illustrated in FIG. 2 is performed based on the initial conditions set in step S201.

In step S203, observation for the imprint material 14 oozing out of the pattern region 8b of the mold 8, that is, the oozing of the imprint material 14 is performed. The observation for the oozing of the imprint material 14 is performed with a measuring device for observation such as a microscope.

In step S204, it is determined, based on the observation result obtained in step S203, whether the oozing of the imprint material 14 has occurred. If the oozing of the imprint material 14 has occurred, the number and positional information of the shot region from which the oozing of the imprint material 14 has been observed are recorded, and the process shifts to step S205. In contrast, if the oozing of the imprint material 14 has not occurred, the process shifts to step S206.

In step S205, irradiation parameters for controlling irradiation with the light 50 by the second irradiation unit 60 are adjusted (changed) based on the number and positional information of the shot region from which the oozing of the imprint material 14 has been observed. Irradiation parameter adjustment is performed for all the shot regions from which the oozing of the imprint material 14 has been observed. In addition, irradiation parameter adjustment is repeated until the oozing of the imprint material 14 does not occur.

In step S206, the alignment accuracy between the mold 8 and the substrate 10 is measured. An alignment accuracy is measured with a measuring device such as an overlay inspection device. 100921 in step S207, it is determined whether the alignment accuracy measured in step S206 satisfies a criterion. If the alignment accuracy satisfies the criterion, the process is terminated. If the alignment accuracy does not satisfy the criterion, the process shifts to step S208.

In step S208, contact parameters for controlling a contact step of bringing the mold 8 into contact with the imprint material 14 on the substrate are adjusted (changed). For example, the relative tilt between the mold 8 and the substrate 10, the force applied to the mold 8 and the imprint material 14 in a contact step, and the pressure applied to the mold (space 13) to deform the pattern region 8a in the contact step are adjusted as contact parameters. When contact parameters are adjusted to improve the alignment accuracy between the mold 8 and the substrate 10, the state of the imprint material 14 oozing out of the pattern region 8b of the mold 8 changes. For this reason, it is necessary to observe for the oozing of the imprint material 14 again. Therefore, when contact parameters are adjusted, the process shifts to step S202 to observe for the oozing of the imprint material 14.

In a general process associated with adjustment for suppressing the oozing of the imprint material 14 and adjustment for alignment accuracy, every time the alignment accuracy is adjusted, it is necessary to perform adjustment to suppress the oozing of the imprint material 14. This requires much time and labor.

On the other hand, the above embodiment is configured to express the relationship between impressing parameters and irradiation parameters for suppressing the oozing of the imprint material 14 in a table. The oozing of the imprint material 14 is suppressed by setting irradiation parameters from the table in accordance with impressing parameters at the time of an imprint process. This makes it possible to eliminate the need for adjustment for suppressing the oozing of the imprint material 14, which is required for every alignment accuracy adjustment, and to easily set irradiation parameters.

Fourth Embodiment

The pattern of a cured product formed using the imprint apparatus 1 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 12A:
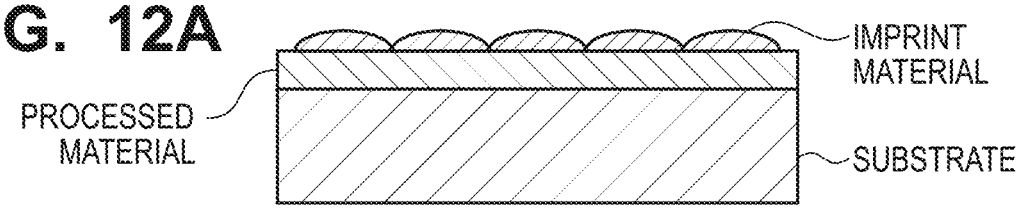
FIG. 12A to FIG. 12F are views for describing an article manufacturing method.

Next, description regarding a detailed method of manufacturing an article is given. As illustrated in FIG. 12A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 12B:
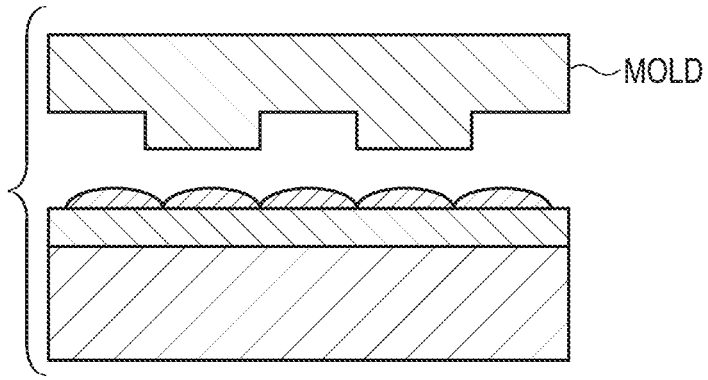
Figure 12C:
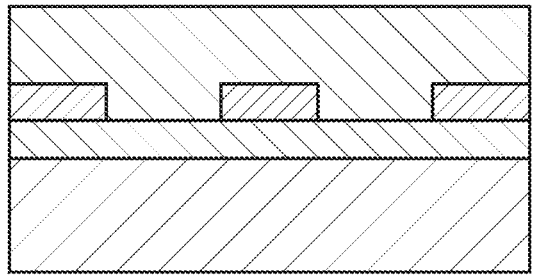

As shown in FIG. 12B, a side of the mold for imprint with a projection and groove pattern is formed on and caused to face the imprint material on the substrate. As illustrated in FIG. 12C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 12D:
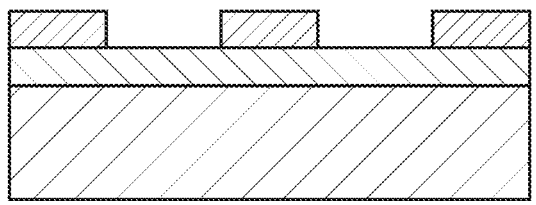

As shown in FIG. 12D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold 4z is transferred to the imprint material.

Figure 12E:
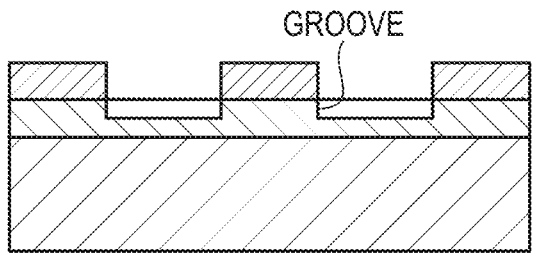
Figure 12F:
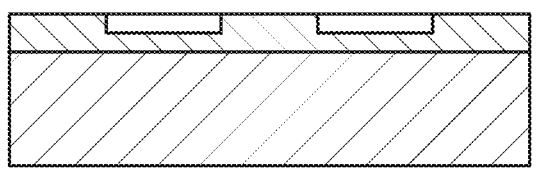

As shown in FIG. 12E, when etching is performed using the pattern of the cured product as an etching resistant mask, a portion of the surface of the processed material where the cured product does not exist or remains thin is removed to form a groove. As shown in FIG. 12F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

The present invention is not limited to the above embodiments and various changes and modifications can be made within the spirit and scope of the present invention. Therefore, to apprise the public of the scope of the present invention, the following claims are made.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2020-019125 filed on Feb. 6, 2020, which is hereby incorporated by reference herein in its entirety.

What is claimed is:

1. An imprint apparatus comprising:
a moving unit configured to bring a mold into contact with an imprint material on a substrate by relatively moving the mold and the substrate;
an irradiation unit configured to irradiate a peripheral region of a pattern region of the mold with light while the mold is in contact with the imprint material on the substrate so as to make a polymerization degree of the imprint material between the peripheral region and the substrate fall within a range higher than a polymerization degree in an initial state when the imprint material is supplied onto the substrate and lower than a polymerization degree in a final state when the imprint material is cured; and
a control unit configured to determine, for each shot region on the substrate, a value of a second parameter that controls irradiation with the light from the irradiation unit based on a value of a first parameter that controls the contact of the mold and the imprint material on the substrate brought by the moving unit,
wherein the first parameter includes at least one of a relative tilt between the mold and the substrate, a force applied to the mold and the imprint material on the substrate in the contact of the mold and the imprint material on the substrate, and a pressure applied to the mold when the pattern region is deformed in the contact of the mold and the imprint material on the substrate.

2. The apparatus according to claim 1, wherein the second parameter includes at least one of a timing when the irradiation unit starts irradiation with the light, an intensity of the light applied from the irradiation unit to the peripheral region, and a period during which the irradiation unit irradiates the peripheral region with the light.

3. The apparatus according to claim 1, wherein the first parameter further includes a period during which the mold is in contact with the imprint material on the substrate.

4. The apparatus according to claim 1, wherein the peripheral region irradiated with the light includes a plurality of regions, and the control unit is configured to control the value of the second parameter for each of the plurality of regions.

5. The apparatus according to claim 1, wherein the control unit is configured to determine the value of the second parameter based on the value of the first parameter so as to set to zero an amount of imprint material oozing out of the pattern region upon completion of the contact of the mold and the imprint material on the substrate.

6. An imprint apparatus comprising:
a moving unit configured to bring a mold into contact with an imprint material on a substrate by relatively moving the mold and the substrate;
an irradiation unit configured to irradiate a peripheral region of a pattern region of the mold with light while the mold is in contact with the imprint material on the substrate so as to make a polymerization degree of the imprint material between the peripheral region and the substrate fall within a range higher than a polymerization degree in an initial state when the imprint material is supplied onto the substrate and lower than a polymerization degree in a final state when the imprint material is cured; and
a control unit configured to determine, for each shot region on the substrate, a value of a second parameter that controls irradiation with the light from the irradiation unit based on a value of a first parameter that controls the contact of the mold and the imprint material on the substrate brought by the moving unit,
wherein the control unit is configured to determine the value of the second parameter based on the value of the first parameter so as to set to zero an amount of imprint material oozing out of the pattern region upon completion of the contact of the mold and the imprint material on the substrate, and wherein the control is configured to determine the value of the second parameter for each shot region on the substrate by selecting, for each value of the first parameter, one table corresponding to the value of the first parameter which is set for each shot region on the substrate from a plurality of tables, each of the plurality of tables indicating a relationship between the value of the first parameter and the value of the second parameter with which the amount of imprint material oozing out of the pattern region upon completion of the contact of the mold and the imprint material on the substrate is set to zero.

7. The apparatus according to claim 6, wherein the control unit is configured to determine the value of the second parameter by selecting one table corresponding to an adjusted value of the first parameter from the plurality of tables every time the value of the first parameter set for each shot region on the substrate is adjusted.

8. An imprint method comprising:
bringing a mold into contact with an imprint material on a substrate;
irradiating a peripheral region of a pattern region of the mold with light while the mold is in contact with the imprint material on the substrate so as to make a polymerization degree of the imprint material between the peripheral region and the substrate fall within a range higher than a polymerization degree in an initial state when the imprint material is supplied onto the substrate and lower than a polymerization degree in a final state when the imprint material is cured; and
determining, for each shot region on the substrate, a value of a second parameter that controls irradiation with the light which is used in the irradiating based on a value of a first parameter that controls the contact of the mold and the imprint material on the substrate,
wherein the first parameter includes at least one of a relative tilt between the mold and the substrate, a force applied to the mold and the imprint material on the substrate in the contact of the mold and the imprint material on the substrate, and a pressure applied to the mold when the pattern region is deformed in the contact of the mold and the imprint material on the substrate.

9. An article manufacturing method comprising:
forming a pattern on a substrate using the imprint apparatus defined in claim 1;
processing the substrate on which the pattern has been formed in the forming; and
manufacturing an article from the processed substrate.

* * * * *